(12) United States Patent
Choi et al.

(10) Patent No.: US 9,847,051 B2
(45) Date of Patent: Dec. 19, 2017

(54) ORGANIC LIGHT-EMITTING DIODE DISPLAY WITH MINIMIZED SUBPIXEL CROSSTALK

(71) Applicant: Apple Inc., Cupertino, CA (US)

(72) Inventors: Jae Won Choi, Cupertino, CA (US); Koorosh Aflatooni, Los Altos Hills, CA (US); Shih Chang Chang, Cupertino, CA (US); Young Bae Park, San Jose, CA (US)

(73) Assignee: Apple Inc., Cupertino, CA (US)

( * ) Notice: Subject to any disclaimer, the term of this patent is extended or adjusted under 35 U.S.C. 154(b) by 80 days.

(21) Appl. No.: 14/875,992

(22) Filed: Oct. 6, 2015

(65) Prior Publication Data

US 2016/0125789 A1    May 5, 2016

Related U.S. Application Data

(60) Provisional application No. 62/075,135, filed on Nov. 4, 2014.

(51) Int. Cl.
*G09G 3/20* (2006.01)
*G09G 3/32* (2016.01)
(Continued)

(52) U.S. Cl.
CPC ......... *G09G 3/2003* (2013.01); *G09G 3/3233* (2013.01); *H01L 27/3209* (2013.01);
(Continued)

(58) Field of Classification Search
CPC .. G09G 3/2074; G09G 3/2003; G09G 3/3225; G09G 3/3275; G09G 2330/028; G09G 2320/0209; G09G 2300/0426; G09G 2300/0452; G09G 3/3233; G09G 2300/0852; G09G 2300/0861; G09G 2320/0219; G09G 2320/0233; G09G 2320/0242; H01L 27/3209; H01L 27/3265;
(Continued)

(56) References Cited

U.S. PATENT DOCUMENTS 8,154,533 B2    4/2012  Jung et al.
2008/0284931 A1  11/2008 Kimura
(Continued)

*Primary Examiner* — Jimmy H Nguyen
*Assistant Examiner* — Yaron Cohen
(74) *Attorney, Agent, or Firm* — Treyz Law Group, P.C.; G. Victor Treyz; David K. Cole

(57) ABSTRACT

An organic light-emitting diode display may have an array of pixels. Each pixel may have multiple subpixels of different colors. To avoid undesired color shifts when operating the display, the display may be configured so that subpixels of different colors are not coupled to each other through parasitic capacitances. The subpixels may include red, green, and blue subpixels or subpixels of other colors. Each subpixel may include an organic light-emitting diode having an anode and a cathode. The anode of each organic light-emitting diode may be coupled to a respective storage capacitor. Capacitive coupling between subpixels can be minimized by configuring the subpixel structures of each pixel so that the storage capacitors of the subpixels do not overlap the anodes of other subpixels in the pixel. Anode and capacitor overlap with subpixel data lines may also be reduced or eliminated.

15 Claims, 8 Drawing Sheets

(51) Int. Cl.
*G09G 3/3233* (2016.01)
*H01L 27/32* (2006.01)
(52) U.S. Cl.
CPC ...... *H01L 27/3265* (2013.01); *H01L 27/3276* (2013.01); *G09G 2300/0426* (2013.01); *G09G 2300/0452* (2013.01); *G09G 2300/0852* (2013.01); *G09G 2300/0861* (2013.01); *G09G 2320/0209* (2013.01); *G09G 2320/0219* (2013.01); *G09G 2320/0233* (2013.01); *G09G 2320/0242* (2013.01); *H01L 27/3216* (2013.01); *H01L 27/3218* (2013.01)
(58) Field of Classification Search
CPC ............. H01L 27/3276; H01L 27/3216; H01L 27/3218
See application file for complete search history.

(56) References Cited

U.S. PATENT DOCUMENTS

| | | | |
|---|---|---|---|
| 2009/0268112 A1* | 10/2009 | Lu | G02F 1/134309 349/38 |
| 2012/0038605 A1 | 2/2012 | Han | |
| 2015/0109189 A1 | 4/2015 | Hwang et al. | |
| 2016/0093247 A1* | 3/2016 | Lim | G09G 3/2003 345/694 |

* cited by examiner

ORGANIC LIGHT-EMITTING DIODE DISPLAY WITH MINIMIZED SUBPIXEL CROSSTALK

This application claims the benefit of provisional patent application No. 62/075,135 filed on Nov. 4, 2014, which is hereby incorporated by reference herein in its entirety.

BACKGROUND

This relates generally to displays, and, more particularly, to organic light-emitting diode displays.

Electronic devices often include displays. Organic light-emitting diode displays may exhibit desirable attributes such as a wide field of view, compact size, and low power consumption.

Organic light-emitting diode displays have arrays of pixels. Each pixel has subpixels of different colors. For example, each pixel may have red, green, and blue subpixels. The amount that each subpixel in a pixel is driven affects the output color of the pixel. For example, when displaying red light, only the red subpixel is used while the green and blue pixels are turned off.

Ideally, adjustments made to one subpixel do not affect the amount of light produced by other subpixels in a pixel. In practice, however, parasitic capacitive coupling effects can give rise to crosstalk. When cross-talk is significant, adjustments to a subpixel of one color can affect subpixel outputs for other colors. If care is not taken, subpixel crosstalk can lead to color inaccuracies and unsatisfactory display performance.

It would therefore be desirable to be able to provide a display with improved subpixel crosstalk performance.

SUMMARY

An organic light-emitting diode display may have an array of pixels. Data lines may supply image data to the pixels. Horizontal control lines such as scan lines and emission control lines may be used in controlling rows of pixels.

Each pixel may have multiple subpixels of different colors. To avoid undesired color shifts when operating the display, the display may be configured to minimize parasitic capacitances that have the potential to capacitively couple subpixels of different colors.

The subpixels may include red, green, and blue subpixels or subpixels of other colors. Each subpixel may include an organic light-emitting diode having an anode and a cathode. The anode of each organic light-emitting diode may be coupled to a respective storage capacitor. Capacitive coupling between subpixels can be minimized by configuring the subpixel structures of each pixel so that the storage capacitors of the subpixels do not overlap the anodes of other subpixels in the pixel.

Overlap between the capacitors and the data lines and between the anodes and the data lines may also be reduced or eliminated.

DETAILED DESCRIPTION

Figure 1:
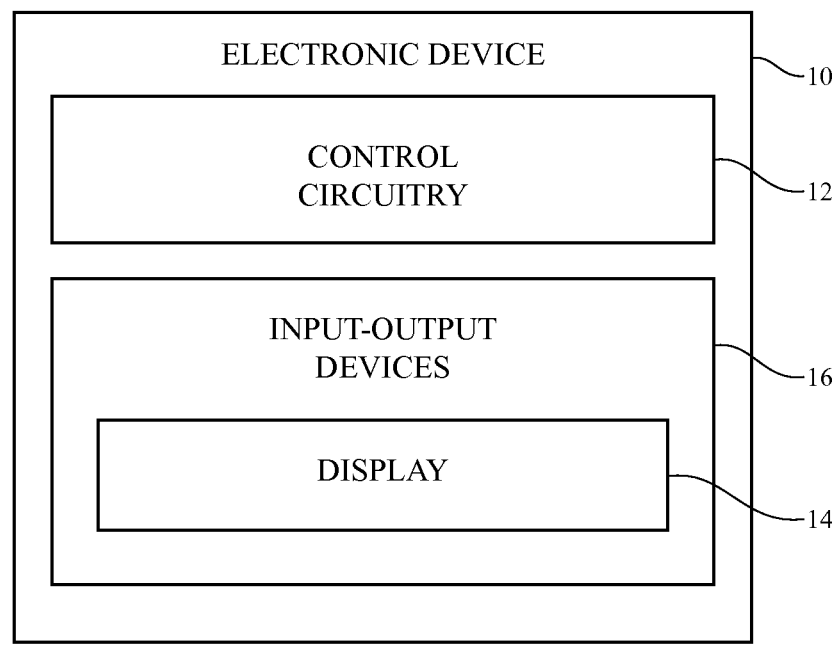
FIG. 1 is a diagram of an illustrative electronic device having a display in accordance with an embodiment.

An illustrative electronic device of the type that may be provided with an organic light-emitting diode display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14.

Figure 2:
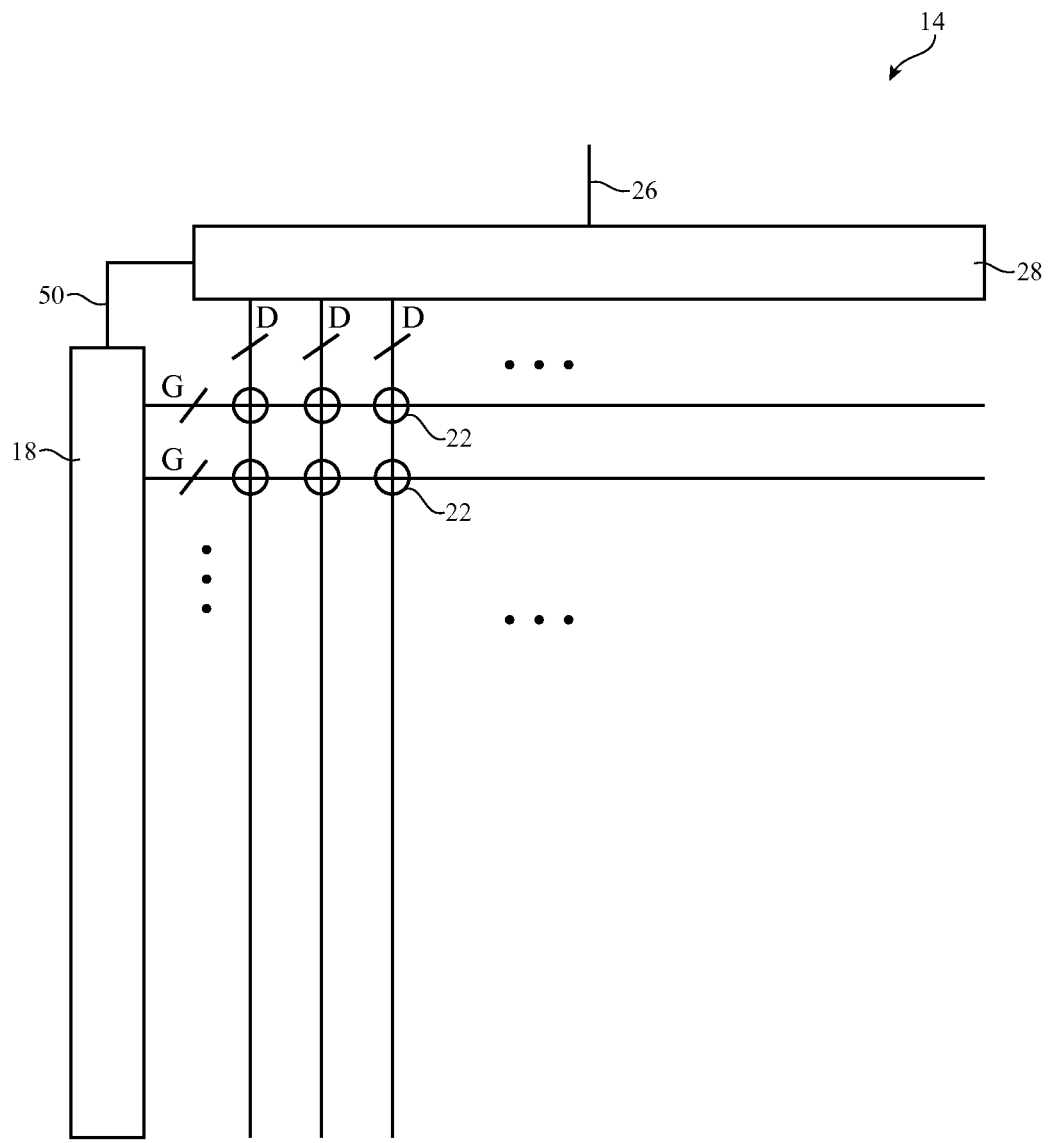
FIG. 2 is a diagram of an illustrative display in accordance with an embodiment.

Display 14 may be an organic light-emitting diode display. FIG. 2 is a diagram of an illustrative organic light-emitting diode display. As shown in FIG. 2, display 14 may have an array of pixels 22 for displaying images for a user. The array of pixels 22 may be arranged to from rows and columns. There may be any suitable number of rows and columns in the array of pixels 22 (e.g., ten or more, one hundred or more, or one thousand or more). Pixels 22 may each contain subpixels of different colors. As an example, each pixel 22 may have a red subpixel that emits red light, a green subpixel that emits green light, and a blue subpixel that emits blue light. Configurations for display 14 that include subpixels of other colors may be used, if desired.

Display driver circuitry may be used to control the operation of pixels 22. The display driver circuitry may be formed from integrated circuits, thin-film transistor circuits, or other suitable circuitry. Display driver circuitry 28 of FIG. 2 may contain communications circuitry for communicating with system control circuitry such as control circuitry 16 of FIG. 1 over path 26. Path 26 may be formed from traces on a flexible printed circuit or other cable. During operation, the control circuitry (e.g., control circuitry 16 of FIG. 1) may supply circuitry 28 with information on images to be displayed on display 14.

To display the images on display pixels 22, display driver circuitry 28 may supply image data to data lines D while issuing clock signals and other control signals to supporting display driver circuitry such as gate driver circuitry 18 over path 50. If desired, circuitry 28 may also supply clock signals and other control signals to gate driver circuitry on an opposing edge of display 14.

Gate driver circuitry 18 (sometimes referred to as horizontal control line control circuitry) may be implemented as part of an integrated circuit and/or may be implemented using thin-film transistor circuitry. Horizontal control lines G in display 14 may gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Each column of pixels 22 preferably includes a sufficient number of data line to supply image data for all of the subpixels of that column (e.g., a red data line for carrying red data signals to red subpixels, a green data line for carrying green data signals to green subpixels, and a blue data line for carrying blue data signals to blue subpixels).

The circuitry for each subpixel may include an organic light-emitting diode, a drive transistor that controls current flow through the diode, and supporting transistors (e.g., switching transistors and emission enable control transistors). The supporting transistors may be used in performing data loading operations and threshold voltage compensation operations for the drive transistors. Storage capacitors may be used to store data signals between successive frames of data.

Figure 3:
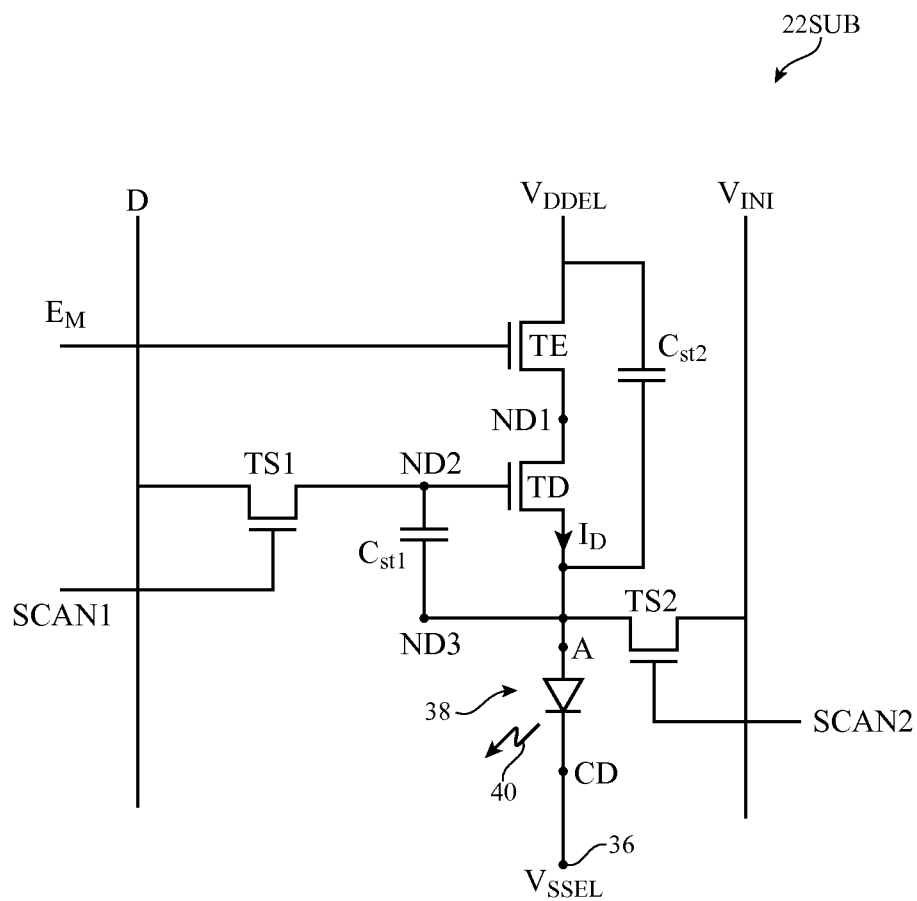
FIG. 3 is a diagram of an illustrative organic light-emitting diode pixel circuit in accordance with an embodiment.

A schematic diagram of an illustrative circuit for an organic light-emitting diode subpixel is shown in FIG. 3. As shown in FIG. 3, each subpixel 22SUB may include an organic light-emitting diode such as organic light-emitting diode 38. Light-emitting diode 38 may emit colored light. For example, in a scenario in which subpixel 22SUB is a red subpixel, organic light-emitting diode 38 may emit red light. Blue subpixels may have blue diodes 38 that emit blue light and green subpixels may have green diodes 38 that emit green light. Arrangements for pixel 22 in which subpixels 22SUB have different colors (yellow, white, light blue, dark blue, etc.) may also be used. Illustrative configurations for display 14 in which each pixel 22 includes a red subpixel 22SUB, a green subpixel 22SUB, and a blue subpixel 22SUB are sometimes described herein as an example. This is, however, merely illustrative. Any suitable subpixel colors may be used in pixels 22 of display 14 if desired.

In each subpixel 22SUB, the state of drive transistor TD controls the amount of drive current ID flowing through diode 38 and therefore the amount of emitted light 40 from subpixel 22SUB. Each diode 38 has an anode A and a cathode CD. Drive current ID flows between anode A and cathode CD. Cathode CD of diode 38 is coupled to ground terminal 36, so cathode terminal CD of diode 38 may sometimes be referred to as the ground terminal for diode 38. Cathode CD may be shared among multiple diodes (i.e., the cathodes CD of multiple diodes may be tied to a shared voltage). Each anode A is individually driven by a respective drive transistor TD.

To ensure that transistor TD is held in a desired state between successive frames of data, subpixel 22SUB may include a storage capacitor such as storage capacitor Cst1. The voltage on storage capacitor Cst1 is applied to the gate of transistor TD at node ND2 to control transistor TD (i.e., to control the magnitude of drive current ID).

Data can be loaded into storage capacitor Cst1 using one or more switching transistors. One or more emission enable transistors may be used in controlling the flow of current through drive transistor TD. In the example of FIG. 3, scan signals SCAN1 and SCAN2 are used to control switching transistors TS1 and TS2. The SCAN1 and SCAN2 signals are used for controlling transistors TS1 and TS2 during threshold voltage compensation operations and data loading operations. The emission control signal EM is used to control emission enable transistor TE (e.g., to disable transistor TD during threshold voltage compensation and data loading operations). Line Vini may be used to supply an initialization voltage to subpixel 22SUB during threshold voltage compensation operations. Subpixel 22SUB may receive a positive power supply voltage such as $V_{DDEL}$ and a ground power supply voltage such as $V_{SSEL}$. Stabilization capacitor Cst2 may be used to help stabilize node ND3 during threshold voltage compensation operations.

If care is not taken, subpixels in each pixel may experience crosstalk. For example, if a storage capacitor Cst1 in a red subpixel (sometimes referred to as capacitor $C_R$) overlaps the anode A for a green subpixel (sometimes referred to as anode $A_G$), capacitive coupling may arise between the red and green subpixels. This may lead to undesired interactions between the subpixels. For example, when the amount of light produced by the red subpixel is decreased, the amount of the light produced by the green subpixel may increase even when no intentional adjustments are being made to the green subpixel. Similarly, when the amount of light produced by the green subpixel is decreased, the red light output from the red subpixel may increase. Crosstalk effects such as these may be associated with undesirable color shifts.

In accordance with an embodiment, the subpixel structures in each pixel 22 may be configured to minimize crosstalk.

Figure 4:
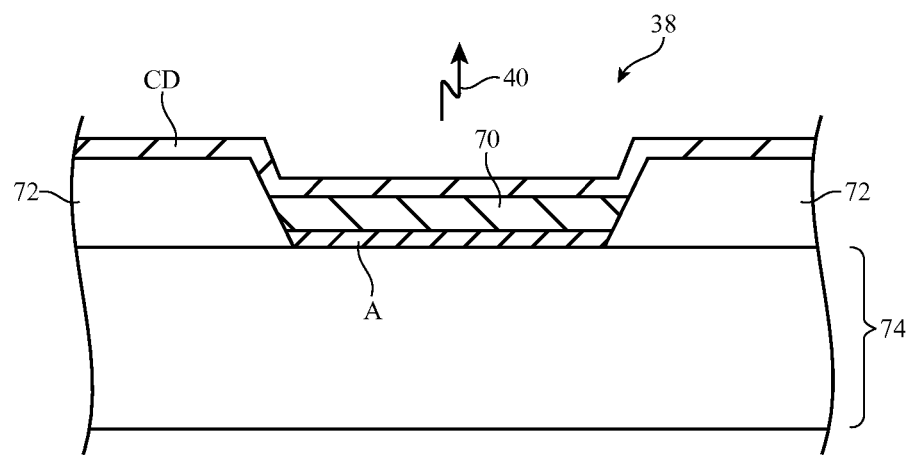
FIG. 4 is a cross-sectional side view of an organic light-emitting diode in accordance with an embodiment.

FIG. 4 is a cross-sectional side view of an illustrative organic light-emitting diode. As shown in FIG. 4, diode 38 may have a layer of emissive material 70 sandwiched between anode A and cathode CD. Anode A may be formed form a patterned metal layer. Cathode CD may be formed from a transparent conductive material such as indium tin oxide and may form a blanket layer over the surface of display 14. Each diode 38 may be formed in an opening in dielectric layer 72. Layer 72, which may sometimes be referred to as a pixel definition layer, may be formed form photoimagable polymer (as an example). Layer 74 may contain thin-film transistor circuitry and a substrate for display 14 (see, e.g., the circuitry of FIG. 3).

Figure 5:
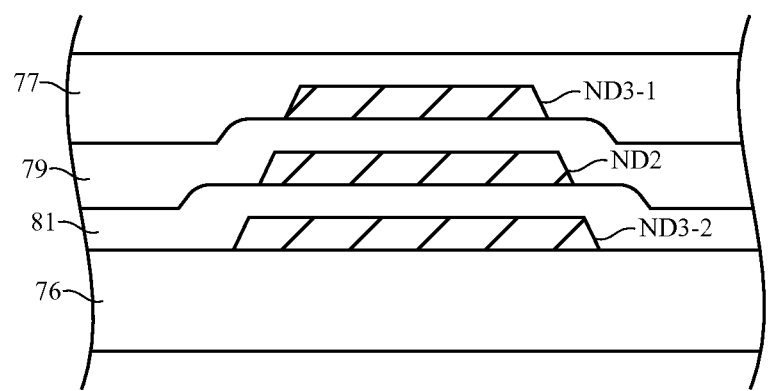
FIG. 5 is a cross-sectional side view of an illustrative storage capacitor for an organic light-emitting diode pixel in accordance with an embodiment.

FIG. 5 is a cross-sectional side view of an illustrative storage capacitor (e.g., capacitor Cst1 of FIG. 3). The structures of FIG. 5 may be formed on substrate 76 (e.g., a dielectric substrate that is optionally coated with one or more layers such as one or more dielectric layers). Layer ND3-2 may be formed from the same material that is used to form the semiconducting channel region of thin-film transistors in the circuitry of FIG. 3 (sometimes referred to as the active layer). This layer may be, for example, a semiconductor layer such as a layer of polysilicon or other silicon layer, a semiconducting oxide layer such as a layer of indium gallium zinc oxide, etc. Gate insulator layer 81 may cover layer ND3-2. Gate insulator layer 81 may be formed from a dielectric such as silicon oxide (as an example). Layer ND2 may be formed from a metal layer. For example, layer ND2 may be formed from portions of a gate metal layer that is used in display 14 to form gate terminals for thin-film transistors in the circuitry of FIG. 3. Interlayer dielectric (ILD) layer 79 may be formed from one or more layers of dielectric material such as silicon oxide, silicon nitride, etc. Layer ND3-1 may be formed on dielectric layer 79. Layer ND3-1 may be formed from the same layer of material (e.g., metal) that is used elsewhere in display 14 to form source-drain contacts for the thin-film transistors of FIG. 3. Dielectric layer 77, which may sometimes be referred to as a passivation layer, may cover layer ND3-1.

Capacitor Cst1 may have a first electrode formed from layer ND2 and a second electrode formed from layers ND3-1 and ND3-2. Layers ND3-1 and ND3-2 may be shorted together at node ND3 of FIG. 3 using a conductive via structure or other conductive path. Layer ND2 may be coupled to anode A of diode 38 at node ND2 of FIG. 3.

Figure 6:
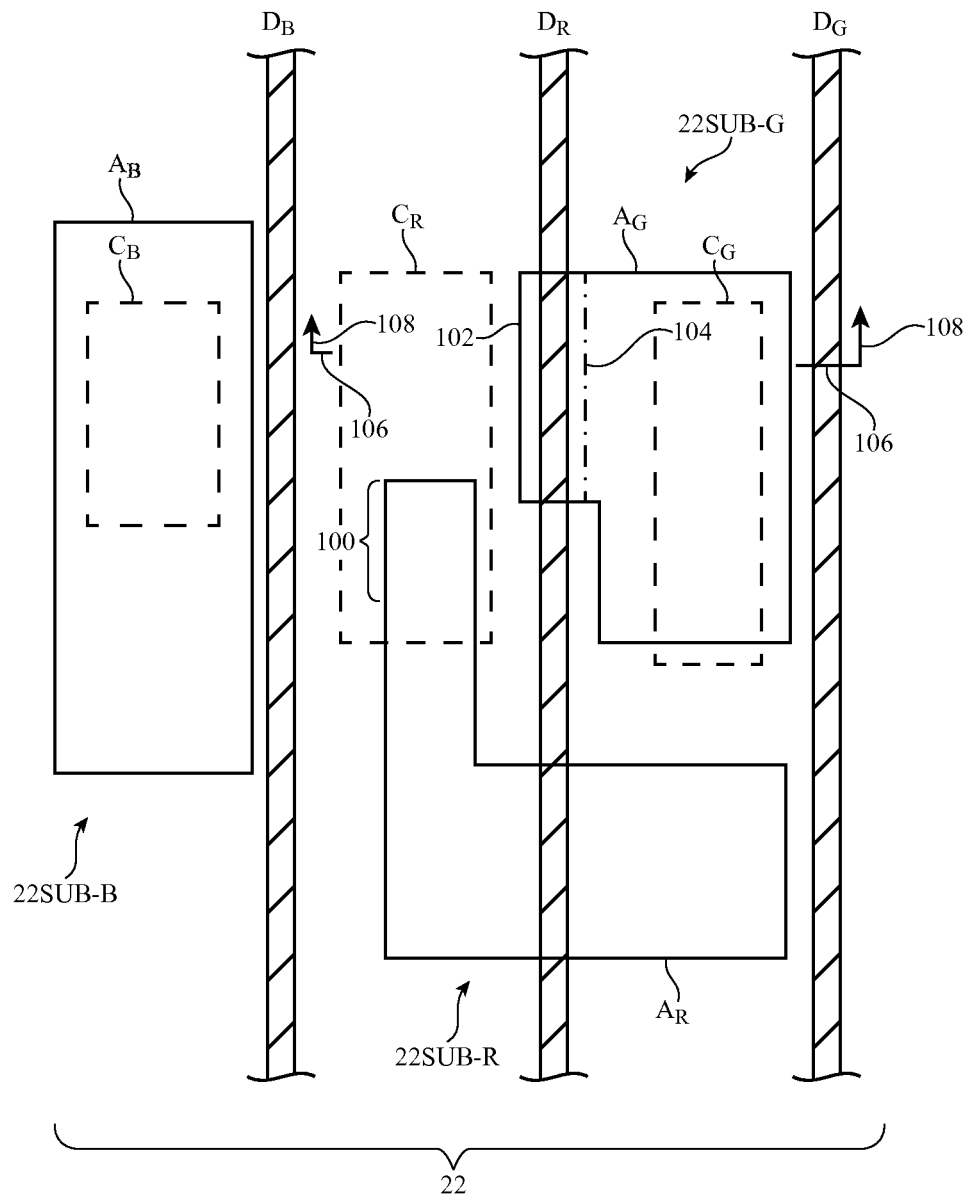
FIG. 6 is a top view of an illustrative organic light-emitting diode pixel showing the relative locations of subpixel anodes, data lines, and storage capacitor electrodes in accordance with an embodiment.

FIG. 6 is a diagram showing how the subpixel structures of pixel 22 may be configured to help minimize subpixel crosstalk. As shown in FIG. 6, pixel 22 may include blue subpixel 22SUB-B, red subpixel 22SUB-R, and green subpixel 22SUB-G. Each subpixel may have an anode A and a storage capacitor C (e.g., a capacitor formed using capacitor electrode structures of the type shown in FIG. 5). Blue subpixel 22SUB-B has blue anode $A_B$ and blue storage capacitor $C_B$. Red subpixel 22SUB-R has red subpixel anode $A_R$ and red storage capacitor electrode $C_R$. Green subpixel 22SUB-G has green anode $A_G$ and green subpixel storage capacitor $C_G$.

Blue data line $D_B$ distributes blue subpixel data signals to blue subpixel 22SUB-B. Red data line $D_R$ is used to distribute red subpixel data signals to red subpixel 22SUB-R. Green data line $D_G$ is used to distribute green subpixel data signals to green subpixel 22SUB-G.

To minimize crosstalk, each capacitor C can be located in a portion of pixel 22 that avoids overlap with anodes of different colors. For example, blue capacitor $C_B$ can be located under blue anode $A_B$, thereby avoiding overlap between $C_B$ and $A_B$ with subpixel structures of other colors. In particular, blue capacitor $C_B$ does not overlap red capacitor $C_R$, green capacitor $C_G$, red anode $A_R$, or green anode $A_G$.

To minimize crosstalk between the red and green subpixels, overlap between the red capacitor and green anode can be avoided or minimized and overlap between the green capacitor and red anode can be avoided or minimized. In the example of FIG. 6, capacitor $C_R$ has portion 100, which overlaps red anode $A_R$, and capacitor CG has a portion that overlaps anode AG, but these overlaps involve subpixel structures for subpixels of the same color and therefore do not give rise to crosstalk. In order to minimize crosstalk, red capacitor $C_R$ preferably does not overlap green capacitor $C_G$ or green anode $A_G$. Red anode $A_R$ also does not overlap green capacitor $C_G$ or green anode $A_G$. In this type of configuration, there is little or no capacitive coupling between red subpixel structures such as red capacitor $C_R$ and anode $A_R$ and green subpixel structures such as green capacitor $G_R$ and anode $A_G$.

Blue data line $D_B$ may be used to provide data to blue subpixel 22SUB-B and preferably does not overlap the structures of red subpixel 22SUB-R and green subpixel 22SUB-G. Red subpixel data may be provided to red subpixel 22SUB-R using red data line $D_R$ and green subpixel data may be provided to green subpixel 22SUB-G using green data line $D_G$. In the example of FIG. 6, green data line DG does not overlap red capacitor $C_R$ or red anode $A_R$, so there is no significant crosstalk contribution from capacitive coupling between green data line $D_G$ and red subpixel 22SUB-R. This helps minimize crosstalk between the red and green subpixels. Red data line $D_R$ may overlap red anode $A_R$, but this generally will not result in crosstalk between the red and green subpixels.

The shape of green anode $A_G$ affects whether there is capacitive coupling between green anode $A_G$ and red data line $D_R$.

In one embodiment, green anode AG has portion 102 that overlaps red data line $D_R$. This may lead to some capacitive coupling between the red and green subpixels, so that if the green data line voltage drops in a given pixel, the gate-source voltage $V_{gs}$ of drive transistor TD in the red subpixel will increase and red output will rise. Because this overlap is relatively small (compared to anode/capacitor overlap scenarios), the impact of crosstalk effects such as these may be acceptably small.

In another embodiment, portion 102 of green anode $A_G$ is omitted (i.e., the leftmost border of green anode $A_G$ in FIG. 6 is given by dashed line 104), thereby eliminating overlap between red subpixel 22SUB-R and green subpixel 22SUB-G and further minimizing or eliminating crosstalk.

Figure 7:
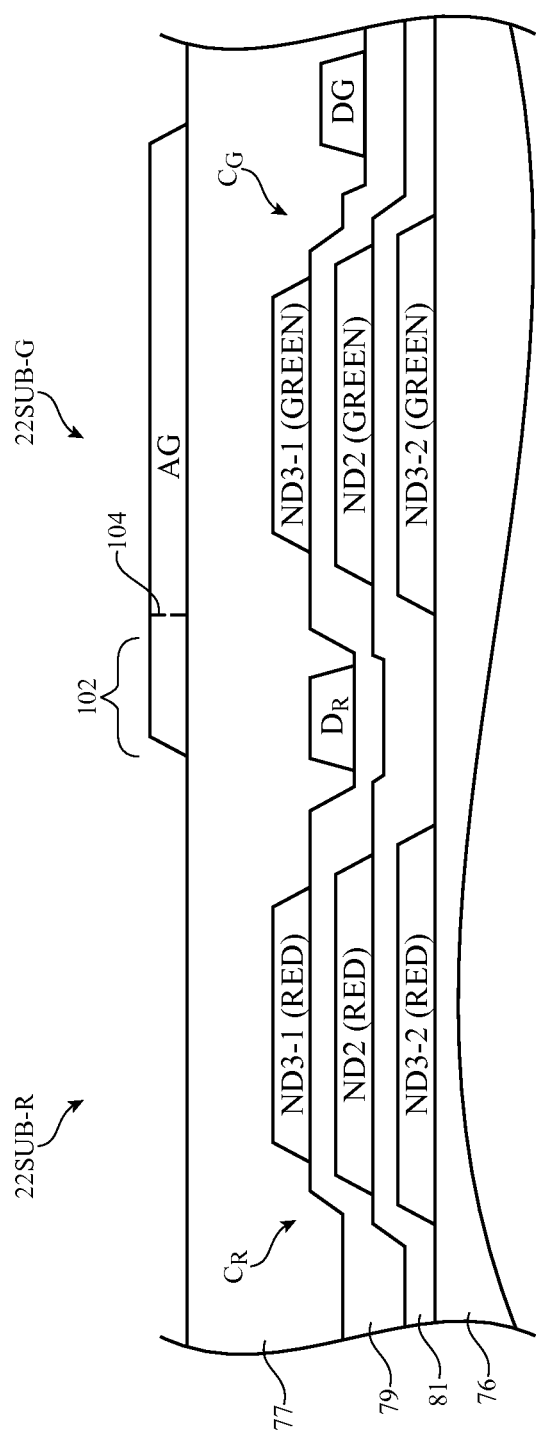
FIG. 7 is a cross-sectional side view of a portion of the illustrative organic light-emitting diode pixel of FIG. 6 showing how a green subpixel anode may be configured to avoid overlap with a red subpixel storage capacitor electrode in accordance with an embodiment.

A cross-sectional side view of the pixel structures of FIG. 6 taken along line 106 and viewed in direction 108 is shown in FIG. 7. As shown in FIG. 7, green anode $A_G$ may have a portion 102 that overlaps red data line $D_R$, giving rise to a small amount of parasitic coupling capacitance. In configurations in which portion 102 is omitted (i.e., by removing the portion of anode $A_G$ to the left of line 104 of FIG. 7 so that none of green anode $A_G$ overlaps red data line $D_R$), coupling between the red and green subpixels may be reduced.

Figure 8:
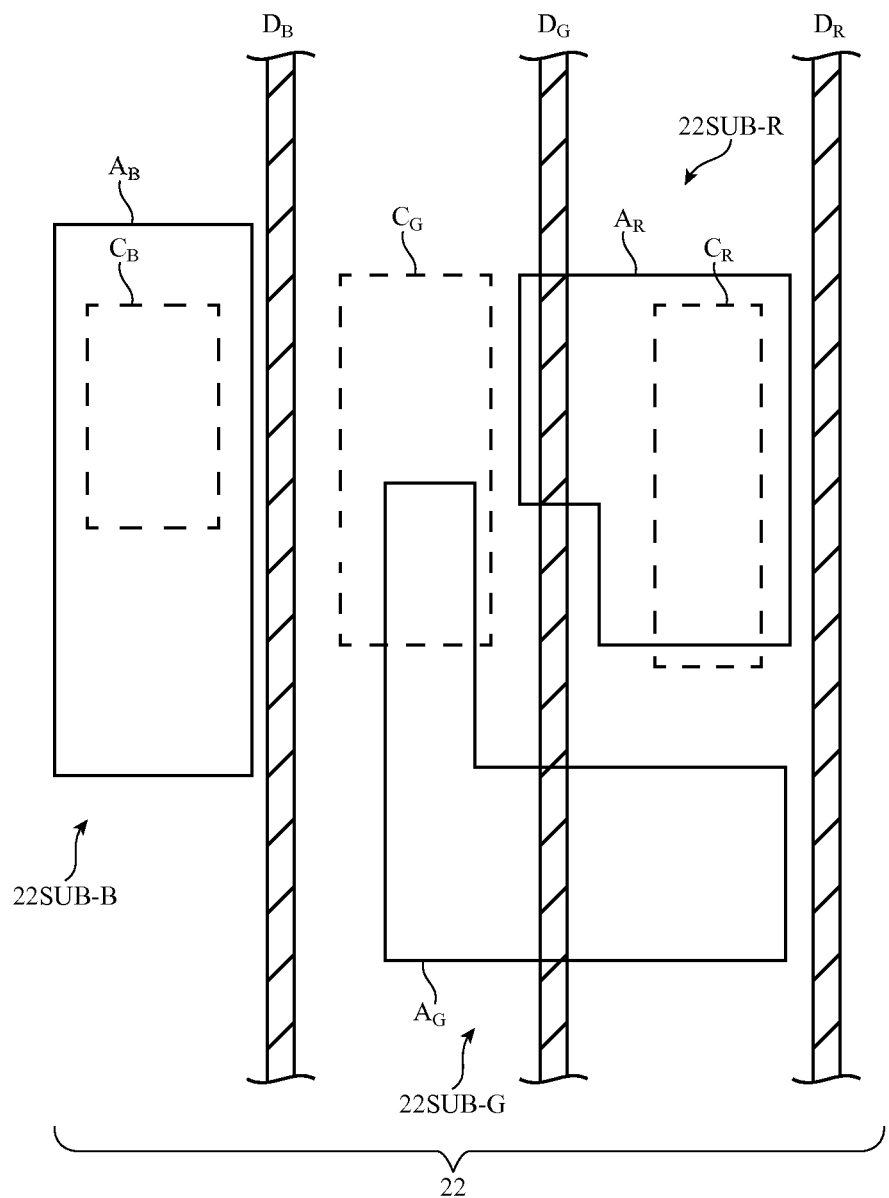
FIG. 8 is a top view of another illustrative organic light-emitting diode pixel in accordance with an embodiment.

In the illustrative example of FIGS. 6 and 7, each pixel 22 has subpixels and associated data lines that are arranged from left to right in the order "blue, red, green." If desired, the subpixels of each pixel 22 may be arranged in other orders. FIG. 8 is a diagram showing how the subpixels in each pixel may be arranged from left to right in the order "blue, green, red." As shown in FIG. 8, the blue subpixel structures of each pixel do not overlap any of the red or green subpixel structures. As described in connection with the arrangement of FIG. 6 in which the red subpixel capacitor and anode structures did not overlap any green subpixel structures, the green capacitor and anode structures of FIG. 8 do not overlap any of the red subpixel (or blue subpixel) structures of pixel 22 of FIG. 8. There may be some overlap between red anode $A_R$ and green data line $D_G$ or the red anode can be reduced in size along its left edge to avoid overlap with data line $D_G$ (as described in connection with omitted data line overlap portion 102 of green anode $A_G$ of FIG. 6).

The foregoing is merely illustrative and various modifications can be made by those skilled in the art without departing from the scope and spirit of the described embodiments. The foregoing embodiments may be implemented individually or in any combination.

What is claimed is:

1. A display, comprising:
an array of pixels, wherein at least one pixel includes a first subpixel of a first color, a second subpixel of a second color, and a third subpixel of a third color and wherein the first subpixel has a first anode for a first light-emitting diode and has a first storage capacitor, the second subpixel has a second anode for a second light-emitting diode and has a second storage capacitor, and the third subpixel has a third anode for a third light-emitting diode and has a third storage capacitor, wherein the first, second, and third storage capacitors are respectively directly connected to, and respectively at least partially overlap the first, second, and third anodes;
control lines that supply control signals to rows of the pixels in the array; and
data lines associated with columns of the pixels in the array, wherein the data lines include a first data line that provides data to the first subpixel, a second data line that provides data to the second subpixel, and a third data line that provides data to the third subpixel, wherein the first storage capacitor does not overlap the second anode and does not overlap the third anode, wherein the second storage capacitor does not overlap the first anode and does not overlap the third anode, wherein a portion of the second storage capacitor does not overlap the second anode, wherein the third storage capacitor does not overlap the first anode and does not overlap the second anode, wherein the first data line is interposed between the first anode and the second anode, wherein the second data line overlaps the second and third anodes, and wherein the third data line is spaced apart from the second and third anodes.

2. The display defined in claim 1 wherein the array of pixels comprises organic light-emitting diode pixels.

3. The display defined in claim 2 wherein the first storage capacitor at least partly overlaps the first anode.

4. The display defined in claim 3 wherein the first subpixel is a blue subpixel.

5. The display defined in claim 4 wherein the second subpixel is a red subpixel and wherein the third subpixel is a green subpixel.

6. The display defined in claim 4 wherein the second subpixel is a green subpixel and the third subpixel is a red subpixel.

7. The display defined in claim 3 wherein the second storage capacitor at least partly overlaps the second anode.

8. The display defined in claim 7 wherein the third storage capacitor at least partly overlaps the third anode.

9. The display defined in claim 8 wherein the second data line does not overlap the second storage capacitor.

10. The display defined in claim 9 wherein the third storage capacitor does not overlap the third data line.

11. The display defined in claim 10 wherein the third storage capacitor does not overlap the second data line.

12. The display defined in claim 10 wherein the third storage capacitor at least partly overlaps the second data line.

13. The display defined in claim 12 wherein the first subpixel is a blue subpixel.

14. The display defined in claim 13 wherein the second subpixel is a red subpixel and wherein the third subpixel is a green subpixel.

15. The display defined in claim 13 wherein the second subpixel is a green subpixel and wherein the third subpixel is a red subpixel.

\* \* \* \* \*